United States Patent
Watanabe (10) Patent No.: US 8,081,781 B2
(45) Date of Patent: Dec. 20, 2011

(54) A/V AMPLIFIER AND METHOD FOR DRIVING THE SAME

(75) Inventor: Atsuo Watanabe, Osaka (JP)

(73) Assignee: Panasonic Corporation, Osaka (JP)

( * ) Notice: Subject to any disclaimer, the term of this patent is extended or adjusted under 35 U.S.C. 154(b) by 1181 days.

(21) Appl. No.: 11/814,791

(22) PCT Filed: Feb. 23, 2006

(86) PCT No.: PCT/JP2006/303223
§ 371 (c)(1),
(2), (4) Date: Jul. 25, 2007

(87) PCT Pub. No.: WO2006/090758

PCT Pub. Date: Aug. 31, 2006

(65) Prior Publication Data
US 2009/0016539 A1    Jan. 15, 2009

(30) Foreign Application Priority Data
Feb. 24, 2005  (JP) .................... 2005-048351

(51) Int. Cl.
*H02B 1/00*    (2006.01)
(52) U.S. Cl. ............ 381/123; 381/81; 381/120; 381/28; 381/22; 381/11
(58) Field of Classification Search .............. 381/22, 381/27–28, 80–81, 120, 123, 11; 330/10
See application file for complete search history.

(56) References Cited

U.S. PATENT DOCUMENTS

| | | | | |
|---|---|---|---|---|
| 4,953,213 A | * | 8/1990 | Tasaki et al. | 381/307 |
| 5,875,250 A | | 2/1999 | Kuo et al. | |
| 6,167,140 A | * | 12/2000 | Watanabe | 381/123 |
| 7,265,617 B2 | * | 9/2007 | Ohkuri | 330/207 A |

FOREIGN PATENT DOCUMENTS

| | | |
|---|---|---|
| EP | 0 080 771 | 6/1983 |
| EP | 0 866 638 | 9/1998 |
| JP | 6047316 | 4/1985 |
| JP | 60192512 | 12/1985 |
| JP | 623119 | 8/1990 |

(Continued)

OTHER PUBLICATIONS

PCT International Search Report dated May 16, 2006.

(Continued)

*Primary Examiner* — Devona Faulk
*Assistant Examiner* — Disler Paul
(74) *Attorney, Agent, or Firm* — Dickinson Wright PLLC (57) ABSTRACT

For achieving an audio reproduction with high sound quality, in a multi-channel A/V amplifier, front speakers are driven with a parallel-drive bi-amplifier arrangement upon stereo reproduction. In the case of the multi-channel reproduction mode, the switching circuit allows an output signal of each channel of the decoder to be sent to speakers via amplifiers for each channel in one-to-one correspondence. On the other hand, in the case of the 2-channel stereo reproduction mode, the switching circuit allows at least two amplifiers among the plurality of amplifiers to be connected in parallel between the output signal for each of the channels L and R of the decoder and the speakers for each of the channels L and R, and also allows the timing of the output signals of the respective amplifiers to be varied.

7 Claims, 5 Drawing Sheets

FOREIGN PATENT DOCUMENTS

| | | |
|---|---|---|
| JP | 09271100 | 10/1997 |
| JP | 2004048333 | 2/2004 |

OTHER PUBLICATIONS

Microfilm of the specification and drawings annexed to the request of Japanese Utility Model Application No. 140747/1983 (Laid-Open No. 47316/1985), (Nippon Columbia Co., Ltd.), Description, p. 2, lines 1 to 7; Fig. 1, Apr. 3, 1985.

Microfilm of the specification and drawings annexed to the request of Japanese Utility Model Application No. 80262/1984 (Laid-open No. 192512/1985), (Nippon Columbia Co., Ltd.), Description, p. 3, lines 5 to 9; Fig. 1, Dec. 20, 1985.

Supplementary European Search Report dated Mar. 4, 2011.

\* cited by examiner

A/V AMPLIFIER AND METHOD FOR DRIVING THE SAME

TECHNICAL FIELD

The present invention relates to an A/V amplifier in which any of a multi-channel reproduction mode and a 2-channel stereo reproduction mode can be selected, and to a method for driving the A/V amplifier.

BACKGROUND ART

For a stereo reproduction with a surround sound system using a multi-channel A/V amplifier, Dolby Surround System is widely known (ref. FIG. 2 in Patent Document 1).

Figure 5:
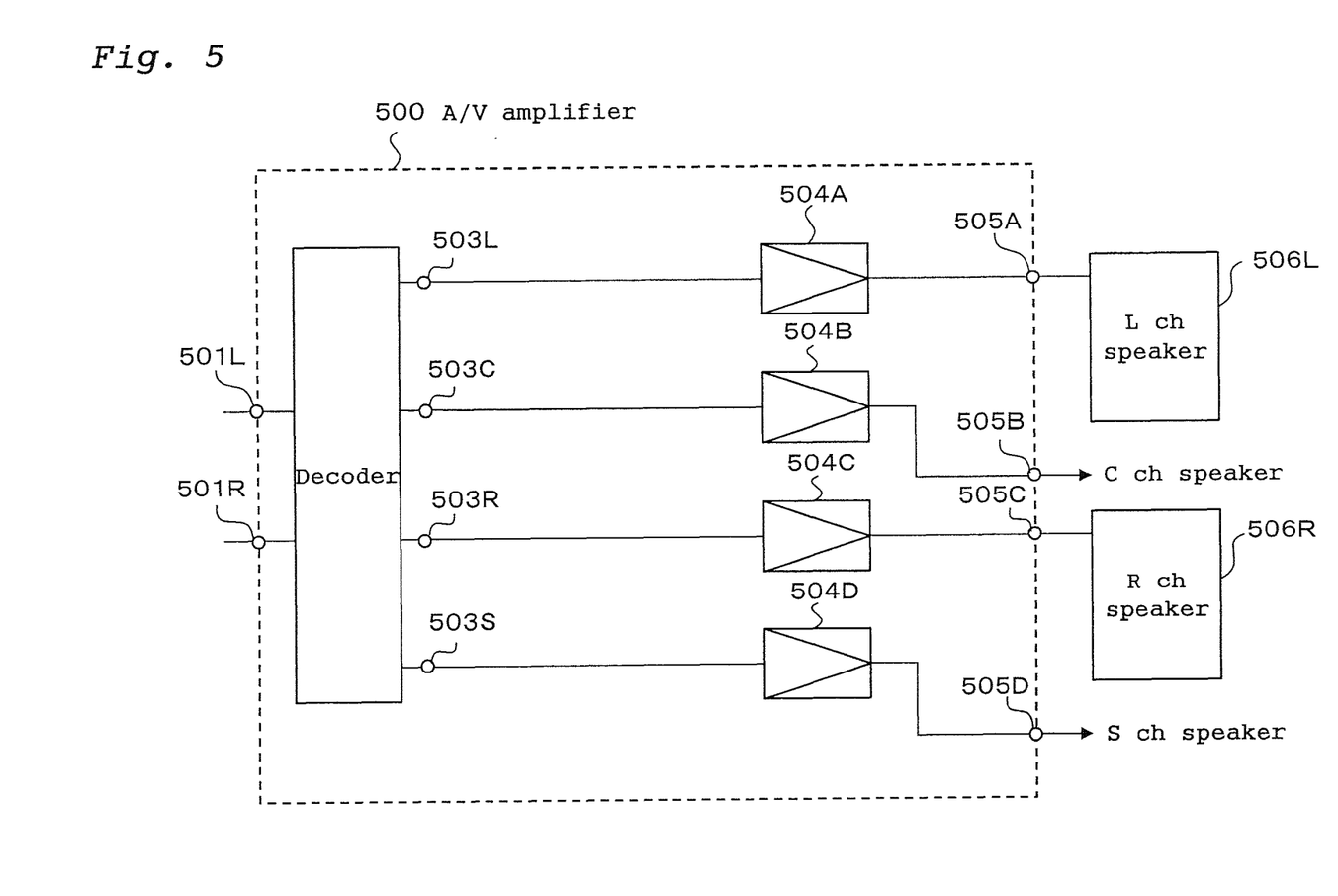
FIG. 5 is a block diagram of a conventional A/V amplifier.

FIG. 5 illustrates a configuration of a conventional A/V amplifier 500 using Dolby Surround System. This A/V amplifier 500 includes four channels, i.e., three channels in front and one channel in rear.

Based on 2-channel (left and right) stereo reproduction signals L and R entered into the terminals 501L and 501R, the decoder 502 produces and outputs four signals in total, i.e., the front left and right outputs 503L and 503R (stereo), the rear output 503S (monaural; in Patent Document 1, outputs from two speakers), and the center output 503C, according to the internal logic.

The above four output signals are amplified by the amplifiers 504A to 504D each provided for the respective outputs, and then sent to the speakers for each channel (in FIG. 5, only the speakers 506L for L-channel and 506R are shown) via the terminals 505A to 505D to cause the respective speakers to produce a sound, thereby achieving a reproduction by the predetermined Dolby Surround system.

[Patent Document 1] Japanese Examined Utility Model Application 6-23119

DISCLOSURE OF THE INVENTION

Problem to be Solved by the Invention

However, in the case of the conventional A/V amplifier as in the above, there has been a problem: upon the 2-channel stereo reproduction, as shown in FIG. 5, the amplifier 504A and the amplifier 504C are used for the L channel and the R channel, respectively, and the amplifier 504B connected to the C channel speaker and the amplifier 504D connected to the S channel speaker are not used, not contributing at all to the sound quality improvement upon the 2-channel reproduction.

The present invention aims to solve the above conventional problem, and to provide an A/V amplifier achieving the sound quality improvement upon 2-channel stereo reproduction, by effectively utilizing the amplifier that was only used in the multi-channel reproduction mode.

Means for Solving the Problem

To achieve the above aim, in the present invention, an A/V amplifier in which a multi-channel reproduction mode and a 2-channel stereo reproduction mode can be selectively switched comprises:

a decoder that decodes a multi-channel encoded input signal and outputs a multi-channel signal in the multi-channel reproduction mode, or outputs a 2-channel stereo input signal as it is in the 2-channel stereo reproduction mode;

a plurality of PWM amplifiers for amplifying the output signal of the decoder, corresponding in number to the number of channels in the multi-channel reproduction mode;

a plurality of terminals connected to a plurality of speakers in one-to-one correspondence, for transmitting the outputs of the plurality of amplifiers to the speakers;

a channel selecting unit for selecting the multi-channel reproduction mode or the 2-channel stereo reproduction mode; and a switching circuit for switching the connective relationship between the decoder and the plurality of amplifiers, and between the plurality of amplifiers and the plurality of terminals according to the mode selection;

wherein when the channel selecting unit selects the multi-channel reproduction mode, the switching circuit allows the output signals for each channel in the decoder to be sent to the plurality of terminals via respective one of the plurality of amplifiers; and when the channel selecting unit selects the 2-channel stereo reproduction mode, the switching circuit allows at least two amplifiers among the plurality of amplifiers to be connected in parallel between the output terminals for each of channels L and R of the decoder and the terminals corresponding to each of the channels L and R, and allows the timing of the output signals of the respective one of the plurality of amplifiers to be varied.

In an A/V amplifier of the present invention, the timing of the output signals of the plurality of amplifiers are preferably varied by connecting delay circuits to the amplifiers in series. Also, the switching circuit preferably includes a plurality of switches, and a control unit for controlling on and off of these pluralities of switches.

Also, in a method for driving an A/V amplifier according to the present invention, the A/V amplifier comprises:
 a decoder that decodes a multi-channel encoded input signal and outputs a multi-channel signal in the multi-channel reproduction mode, or outputs a 2-channel stereo input signal as it is in the 2-channel stereo reproduction mode; and
 a plurality of PWM amplifiers for amplifying the output signal of the decoder, corresponding in number to the number of channels in the multi-channel reproduction mode,
 wherein selective switching between the multi-channel reproduction mode and the 2-channel stereo reproduction mode is possible:
the method comprising:
 in the multi-channel reproduction mode, sending the output signals for each channel in the decoder to speakers of the respective channels via the respective one of the plurality of amplifiers by a switching circuit, and
 in the 2-channel stereo reproduction mode,
 connecting at least two amplifiers among the plurality of amplifiers in parallel between the output signals for each of channels L and R of the decoder and the speakers corresponding to each of the channels L and R by the switching circuit, and
 varying the timing of the output signals of the respective one of the plurality of amplifiers.

EFFECT OF THE INVENTION

In the present invention, high quality sound is embodied with a parallel-drive bi-amplifier reproduction upon the 2-channel stereo reproduction to realize a significant improvement in sound quality at low cost, by adding a simple switching circuit and a delay circuit to a multi-channel A/V amplifier in a popular price range.

BEST MODE FOR CARRYING OUT THE INVENTION

In the following, an A/V amplifier in an embodiment of the present invention is described by referring to the drawings.

Figure 1:
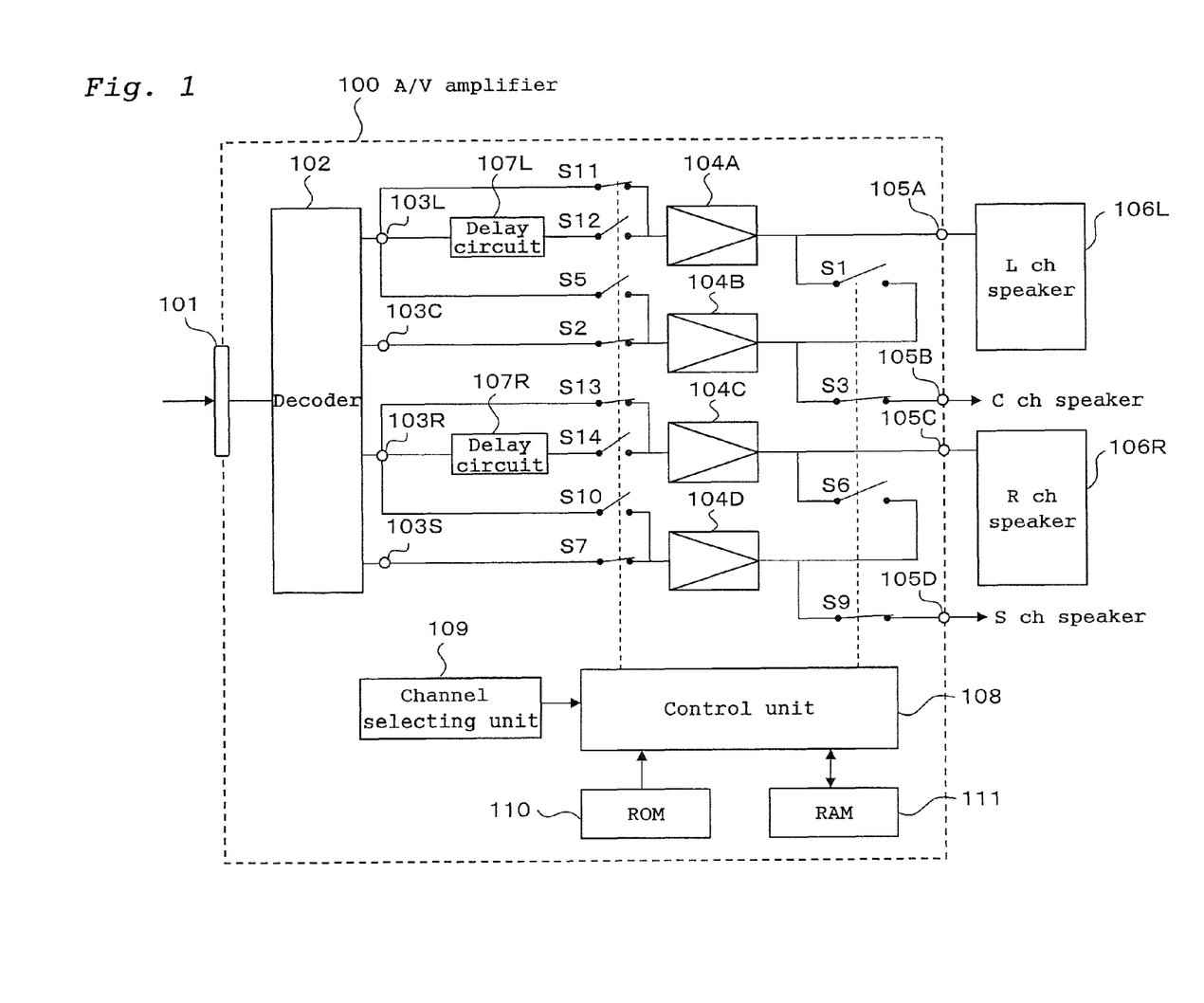
FIG. 1 is a block diagram illustrating a connection arrangement in the multi-channel reproduction mode of an A/V amplifier in an embodiment of the present invention.
Figure 2:
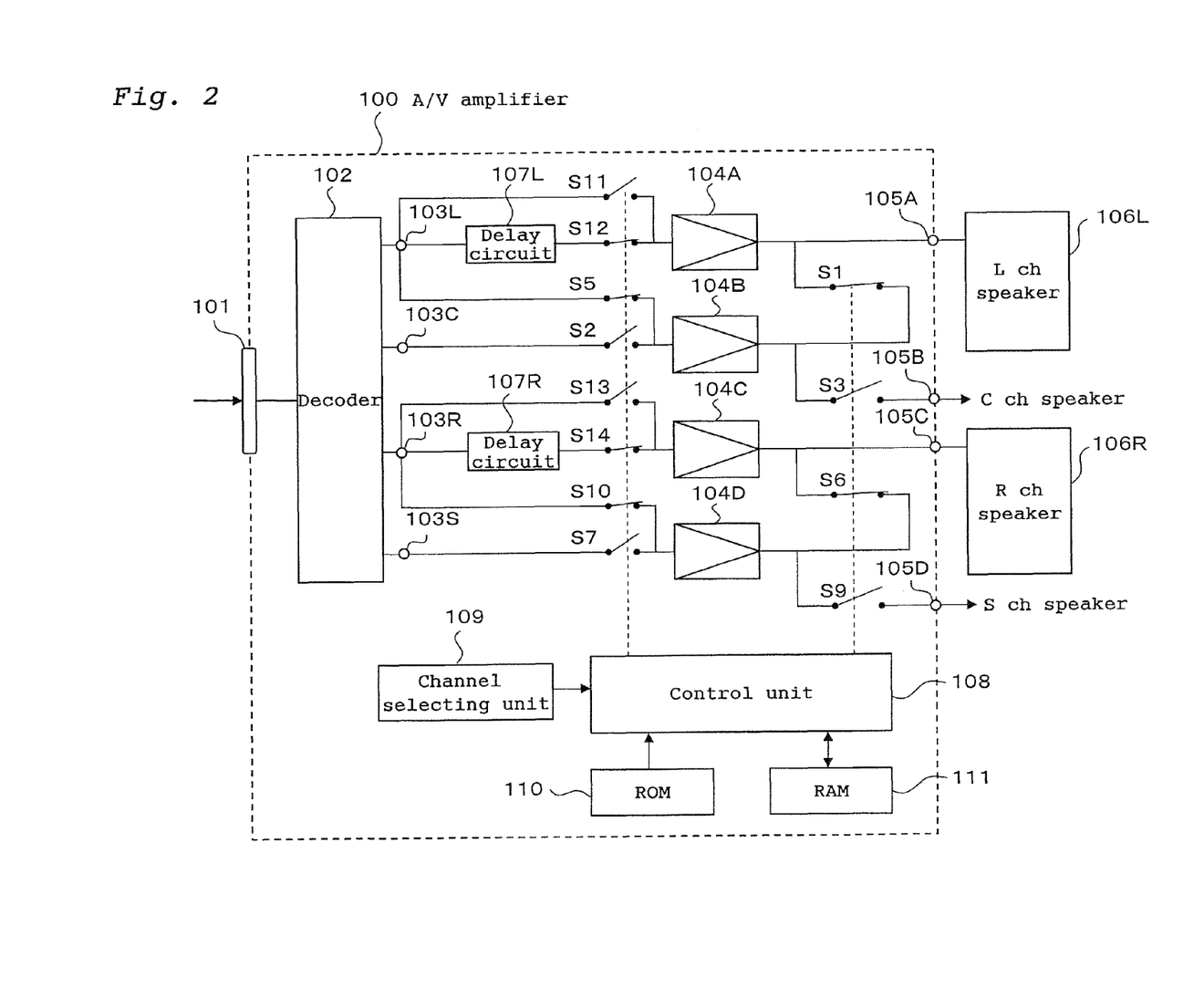
FIG. 2 is a block diagram illustrating a connection arrangement in the 2-channel stereo reproduction mode of an A/V amplifier in an embodiment of the present invention.

FIG. 1 is a block diagram illustrating a connection arrangement of an A/V amplifier upon the multi-channel reproduction in an embodiment of the present invention, and FIG. 2 is a block diagram illustrating a connection arrangement of the same A/V amplifier upon the 2-channel stereo reproduction.

First, by referring to FIG. 1, a configuration and a function of each unit of an A/V amplifier in this embodiment are described.

In FIG. 1, reference numeral 102 refers to a Pro Logic decoder. The decoder 102 includes an input terminal unit 101, and to the input terminal unit 101, an input signal in which a 4-channel sound information and the like is encoded enters. The decoder 102 also includes the first to fourth signal sources, i.e., output terminals 103L, 103C, 103R, and 103S, from which signals for L-channel, C-channel, R-channel, and S-channel are output, respectively. Since the decoding method in the decoder 102 is known, its description is omitted.

Reference numerals 104A to 104D refer to amplifiers. In this embodiment, for the amplifiers 104A to 104D, a PWM (pulse width modulation) amplifier is used. An input side of the amplifier 104A for L-channel, i.e., the first amplifier, is connected to the output terminal 103L of the decoder 102 via a switch S11. On the other hand, an output side is connected to the output terminal 105A for an L-channel speaker 106L, and further to an output side of the amplifier 104B for C-channel via a switch S1.

An input side of the second amplifier, i.e., the amplifier 104B, is connected to the output terminal 103C of the decoder 102 via a switch S2. On the other hand, an output side is connected to the output terminal 105A for a speaker 106L via a switch S1, and further to an output terminal 105B for a C-channel speaker (not shown), i.e., the second speaker, via a switch S3.

Also connected to the input side of the amplifier 104A, via a switch S12, is a first delay circuit 107L, between the input side of the amplifier 104A and the output terminal 103L of the decoder 102. Further, the input side of the amplifier 104B is connected, via a switch S5, to the output terminal 103L of the decoder 102.

An input side of the amplifier 104C for k-channel, i.e., the third amplifier, is connected to the output terminal 103R of the decoder 102 via a switch S13. On the other hand, an output side is connected to the output terminal 105C for an R-channel speaker 106R, i.e., the third speaker, and further to an output side of the amplifier 104D for S-channel, i.e., the fourth amplifier, via a switch S6.

An input side of the amplifier 104D, i.e., the fourth amplifier, is connected to the output terminal 103S of the decoder via a switch S7. On the other hand, an output side is connected to the output terminal 105D for a speaker 106R via a switch S6, and further to the output terminal 105D for an S-channel speaker (not shown), i.e., the fourth speaker, via a switch S9.

Also connected to the input side of the amplifier 104C, via a switch S14, is a second delay circuit 107R, between the input side of the amplifier 104C and the output terminal 103R of the decoder 102. Further, the input side of the amplifier 104D is connected, via a switch S10, to the output terminal 103R of the decoder 102.

Reference numeral 108 is a control unit including a CPU (Central Processing Unit), and along with the switches S1 to S14, forms a switching circuit. The control unit 108 controls on and off of the switches S1 to S14, according to the selection information provided by a channel selecting unit 109. For the switches S1 to S14, synchronized switches are used, so that the switches are simultaneously turned on or off.

The channel selecting unit 109 is provided on an operation panel of the A/V amplifier 100, and operated by a user. The channel selecting unit 109 selects the 2-channel stereo reproduction mode or the 4-channel reproduction mode. Reference numeral 110 is a ROM in which an operation program of the control unit 108 is stored, and the control unit 108 carries out operations according to this operation program. Reference numeral 111 is a RAM. The RAM 103 functions as a working memory for storing various working data generated upon a program operation of the control unit 108.

Operations of the A/V amplifier 100 configured as in the above are described in the following. First, based on FIG. 1, operations in the multi-channel reproduction mode, which is general in home theater reproduction devices, are described.

When the channel selecting unit 111 selects the multi-channel reproduction mode, a multi-channel encoded source such as a movie and the like enters through the input terminal unit 101 of the decoder 102, is separated into four signals in the decoder 102, and is output to the output terminals 103L, 103C, 103R, and 103S. At this time, the control unit 108 turns on the switches S2, S3, S7, S9, S11, and S13, and turns off the switches S1, S5, S6, S10, S12, and S14.

The output signal of the output terminal 103L of the decoder 102 is amplified at the amplifier 104A, since the switches S5 and S12 are open and the switch S11 is closed; and applied to the L-channel speaker 106L via the terminal 105 A, since the switch S1 is open, for a reproduction in the normal mode.

The output of the output terminal 103R of the decoder 102 is amplified at the amplifier 104C, since the switches S10 and S14 are open and the switch S13 is closed; and applied to the R-channel speaker 106R via the terminal 105C, since the switch S6 is open, for a reproduction in the normal mode.

On the other hand, the output signal of the output terminal 103C of the decoder 102 is amplified at the amplifier 104B, since the switch S2 is closed; and applied to the C-channel speaker via the terminal 105B to be reproduced, since the switch S1 is open and the switch S3 is closed. Similarly, the output signal of the output terminal 103S of the decoder 102 is amplified at the amplifier 104D since the switch S7 is closed; and applied to the S-channel speaker via the terminal 105D to be reproduced, since the switch S6 is open and the switch S9 is closed. The delay circuits 107L and 107R are not in operation, since the switches S5, S10, S12, and S14 are open.

Next, based on FIG. 2, operations in a usual 2-channel stereo reproduction mode are described. The signals to be output from the decoder 102 are only for the L-channel and the R-channel. With regard to the L-channel, when the channel selecting unit 111 selects the 2-channel stereo reproduction mode, the control unit 108 closes the switches S1, S5, and S12, and opens the switches S2, S3, and S11. The output signal of the output terminal 103L of the decoder 102 enters the amplifier 104A from the switch S12 via the delay circuit 107L, and after being amplified by the amplifier 104A, output to the L-channel speaker 106L via the terminal 105A. Further, the output signal of the output terminal 103L of the decoder 102 enters the amplifier 104B, i.e., the second amplifier for L-channel via the switch S5, and after being amplified at the amplifier 104B, output to the terminal 105A of the L-channel speaker 106L via the switch S1. Thus, the output signal of the output terminal 103L goes through two pathways, thereby driving the L-channel reproduction speaker 106L with the parallel-drive bi-amplifier system.

In this case, upon the multi-channel reproduction, since the amplifier 104A, i.e., the amplifier for L-channel and the amplifier 104B, i.e., the amplifier for C-channel are connected in parallel, the L-channel speaker 106L is driven at a low impedance; therefore, the effects of increasing the damping factor, which are effective in sound quality improvement of low-range component, can be expected.

Figure 3:
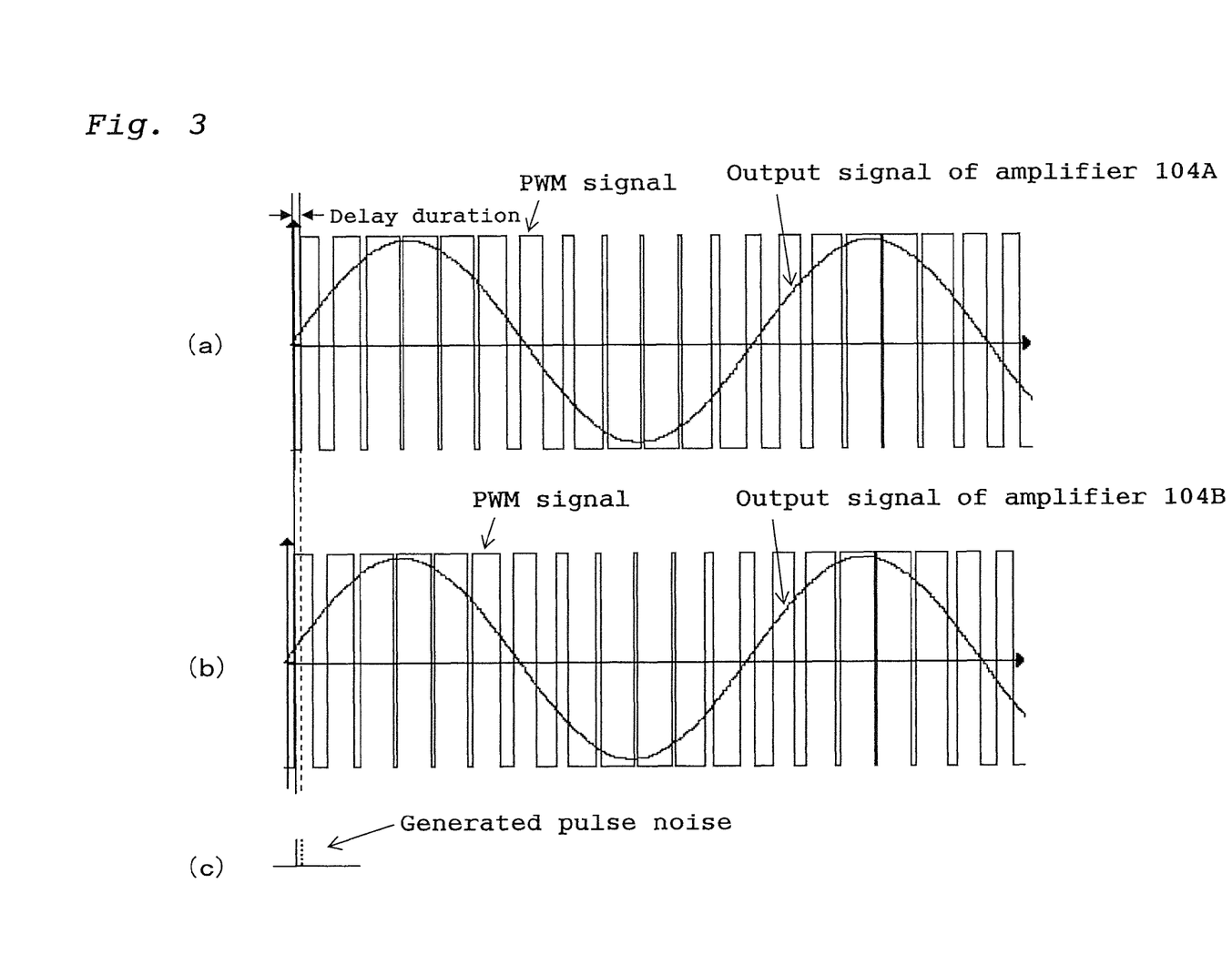
FIG. 3 shows diagrams illustrating a relationship between output signals of amplifiers and a generated noise in the 2-channel stereo reproduction mode.
Figure 4:
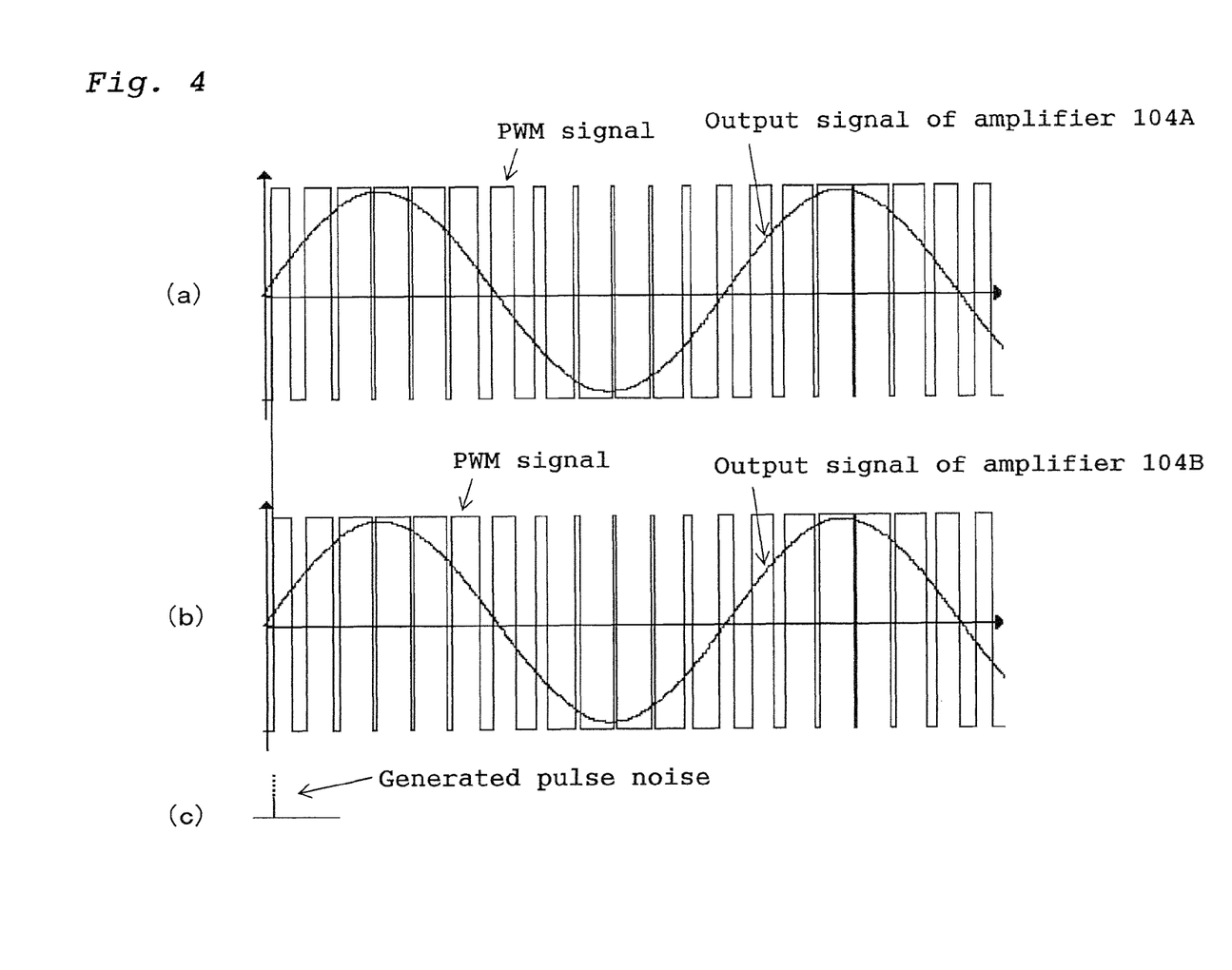
FIG. 4 shows diagrams illustrating a relationship between output signals of amplifiers and a generated noise in the 2-channel stereo reproduction mode with no delay in the output signals.

Next, functions of the delay circuits 107L and 107R are described by referring to FIG. 3 and FIG. 4. FIG. 3 (a) to (c) show the output wave forms when the timing of the output signals of the amplifiers 104A and 104B is varied by the delay circuit 107L, instead of being synchronized; and the noise generated at that time. On the other hand, FIG. 4(a) to (c) show the wave forms of the output signals of the amplifiers—104A and 104B when the delay circuit 107L is not provided; and the noise generated at that time. In both FIG. 3 and FIG. 4, the noise is shown for just one wave form for a simple illustration.

As is clear from the comparison between FIG. 3 and FIG. 4, without the delay circuit 107L, as illustrated by the sum of the solid line and the broken line in the noise wave form of FIG. 4(c), the timing of the noises generated by the two amplifiers coincides to generates a high-level noise. On the other hand, by varying the input timing of the input signal of the amplifiers 104A and 104B with the delay circuit 107L, as illustrated by the solid line and the broken line in FIG. 3(c), the delay in one of the noises generated in the case of the non-feedback full digital amplifier can curb the overlay, and achieves a direct coupling without being affected by the feedback circuit of the other amplifier.

In the delay circuit 107L, the delay duration may be set, for example, as in the following: when the sampling frequency Fs is 48 kHz, and a PWM modulator designed to enable a division into 256 relative to a wavelength of ¼ is used, at least ±(1/256) relative to the wavelength of ¼ may be delayed. Thus, the duration is about $$(1/48000) \div 4 \times (2/256) = 0.041 \, \mu s.$$

The delay duration is determined by considering the optimum value of distortion and the like in the circuit upon parallel-drive, setting the above value as the minimum value.

For the R-channel, similarly, the switches S6, S10, and S14 are closed, and the switches S7, S9, and S13 are open. The output signal of the output terminal 103R of the decoder 102 is separated to two: the pathway in which the signal goes through the delay circuit 107R and the switch S14, is amplified by the amplifier 104C, and then output from the terminal 105C to the R-channel speaker 106R; and the pathway in which the signal goes through the switch S10 and amplified by the fourth amplifier 104D for R-channel, and then connected to the output terminal 105C of the R-channel speaker 106R via the switch S6, thereby driving the bi-wiring reproduction speaker 106R for R-channel with the parallel-drive bi-amplifier system.

In this case as well, upon the multi-channel reproduction, the amplifier 104C, i.e., the amplifier for R-channel and the amplifier 104D, i.e., the amplifier for S-channel are connected in parallel, thereby driving the R-channel speaker 106R with a low impedance; therefore, the effects of increasing the damping factor, which are effective in sound quality improvement of the low-range component, can be expected.

Further, similarly to the case of the L-channel, by varying the input timing of the input signal of the parallel-drive amplifiers with the delay circuit 107R, as illustrated by the solid line and the broken line in FIG. 3(c), the delay in one of the noises generated in the case of the non-feedback full digital amplifier can curb the overlay, and achieves direct coupling without being affected by the feedback circuit of the other amplifier.

As described above, based on this embodiment, by adding a switching circuit and a delay circuit of simple configuration to the A/V amplifier, the amplifier for the multi-channel reproduction can be effectively utilized upon the 2-channel stereo reproduction, and the improvement in sound quality upon stereo reproduction can be achieved.

In this embodiment, although those switches that turn on and off are used for the switches S1 to S14, the number of the switches can be decreased by using changeover switches for the switches S1 and S3, and the switches S6 and S9; removing the switches S2, S5, S7, S10, S11, S12, S13, and S14; providing changeover switches instead to the amplifiers 104A, 104B, 104C, and 104D.

Also, the position of the switches are not limited to those illustrated, and are satisfactory as long as the signal pathway can be switched between each of the amplifiers, the delay circuits, and the speakers for the connection that can bring out the effects of the present invention.

Further, although in this embodiment, the case when two amplifiers are driven in parallel is described, three or more amplifiers may be driven in parallel. In that case, the number of delay circuits necessary will be the number of amplifiers—1. The switches may be increased based on the configuration of FIG. 1.

INDUSTRIAL APPLICABILITY

An A/V amplifier of the present invention is highly industrially applicable, since the present invention contributes to the sound quality improvement of audio devices in which any of the multi-channel reproduction mode and the 2-channel stereo reproduction mode can be selected.

The invention claimed is:
1. An A/V amplifier selectively switchable between a multi-channel reproduction mode and a 2-channel stereo reproduction mode, the A/V amplifier comprising:
a decoder that decodes a multi-channel encoded input signal and outputs a multi-channel signal in the multi-channel reproduction mode, or outputs a 2-channel stereo signal in the 2-channel stereo reproduction mode;

a plurality of PWM amplifiers for amplifying an output signal of said decoder, corresponding in number to a number of channels in the multi-channel reproduction mode;

a plurality of terminals connected to a plurality of speakers in one-to-one correspondence, for transmitting outputs of said plurality of amplifiers to said speakers;

a channel selecting unit for selecting the multi-channel reproduction mode or the 2- channel stereo reproduction mode; and a switching circuit for switching a connective relationship between said decoder and said plurality of amplifiers, and between said plurality of amplifiers and said plurality of terminals according to the mode selection;

wherein when said channel selecting unit selects the multi-channel reproduction mode, said switching circuit enables the output signal for each channel in said decoder to be sent to said plurality of terminals via a respective one of said plurality of amplifiers; and when said channel selecting unit selects the 2-channel stereo reproduction mode, said switching circuit enables at least two amplifiers among said plurality of amplifiers to be connected in parallel between output terminals for each of channels L and R of said decoder and said terminals corresponding to each of the channels L and R, and enables timing of noise in output signals of the plurality of amplifiers to be varied.

2. The A/V amplifier in accordance with claim 1, wherein the timing of the noise in the output signals of said plurality of amplifiers is varied by connecting delay circuits to said plurality of amplifiers in series.

3. The A/V amplifier in accordance with claim 1, wherein said switching circuit includes a plurality of switches, and a control unit for controlling said plurality of switches to be turned on and off.

4. The A/V amplifier according to claim 1, wherein the timing is varied according to a sampling frequency of the output signal amplified by the PWM amplifiers and a quantization bit rate of the PWM amplifiers.

5. A method for driving an A/V amplifier,
said A/V amplifier comprising:
a decoder that decodes a multi-channel encoded input signal and outputs a multi-channel signal in a multi-channel reproduction mode, or outputs a 2-channel stereo signal in a 2-channel stereo reproduction mode; and a plurality of PWM amplifiers for amplifying an output signal of said decoder, corresponding in number to a number of channels in the multi-channel reproduction mode, wherein the method is configured to perform selective switching between the multi-channel reproduction mode and the 2-channel stereo reproduction mode, the method comprising:
in the multi-channel reproduction mode, sending output signals for each channel in said decoder to speakers of the respective channels via a respective one of said plurality of amplifiers by a switching circuit, and in the 2-channel stereo reproduction mode,
connecting at least two amplifiers among said plurality of amplifiers in parallel between output signals for each of channels L and R of said decoder and speakers corresponding to each of the channels L and R by said switching circuit, and varying timing of noise in the output signals of the plurality of amplifiers.

6. The method for driving an A/V amplifier according to claim 5, wherein the varying of said timing of the noise in the output signals of said plurality of amplifiers comprises connecting delay circuits to said plurality of amplifiers in series.

7. The method for driving an A/V according to claim 5, wherein the varying of the timing comprises varying the timing according to a sampling frequency of the output signal amplified by the PWM amplifiers and a quantization bit rate of the PWM amplifiers.

* * * * *